(12) United States Patent
Kang et al.

(10) Patent No.: US 12,653,002 B2
(45) Date of Patent: Jun. 9, 2026

(54) METHOD OF MANUFACTURING SEMICONDUCTOR DEVICE

(71) Applicant: SAMSUNG ELECTRONICS CO., LTD., Suwon-si (KR)

(72) Inventors: Sungkun Kang, Hwaseong-si (KR); Chawon Koh, Yongin-si (KR); Hyunjae Lee, Hwaseong-si (KR); Tsunehiro Nishi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 877 days.

(21) Appl. No.: 17/902,142

(22) Filed: Sep. 2, 2022

(65) Prior Publication Data

US 2023/0076633 A1 Mar. 9, 2023

(30) Foreign Application Priority Data

Sep. 6, 2021 (KR) ........................ 10-2021-0118548

(51) Int. Cl.
| | |
|---|---|
| *H10P 76/40* | (2026.01) |
| *G03F 7/004* | (2006.01) |
| *H01J 37/32* | (2006.01) |
| *H10P 50/28* | (2026.01) |
| *H10P 76/20* | (2026.01) |

(52) U.S. Cl.
CPC ............ *H10P 76/40* (2026.01); *G03F 7/0044* (2013.01); *H01J 37/3244* (2013.01); *H10P 50/283* (2026.01); *H10P 76/204* (2026.01)

(58) Field of Classification Search
CPC ................................................ H01M 21/31116
See application file for complete search history.

(56) References Cited

U.S. PATENT DOCUMENTS

| | | | |
|---|---|---|---|
| 9,469,912 | B2 | 10/2016 | Buckalew et al. |
| 9,666,436 | B2 | 5/2017 | Xu et al. |
| 10,312,075 | B2 | 6/2019 | Kao et al. |
| 10,494,715 | B2 | 12/2019 | Agarwal et al. |
| 10,510,586 | B1 * | 12/2019 | Liou ................... H01L 21/0273 |
| 11,392,035 | B2 * | 7/2022 | Wang ................ H01L 21/31127 |
| 12,362,180 | B2 * | 7/2025 | Chen ................... H01L 21/0274 |
| 2010/0009542 | A1 * | 1/2010 | Honda ................ H01L 21/0338 |
| | | | 257/E21.241 |

(Continued)

FOREIGN PATENT DOCUMENTS

| | | |
|---|---|---|
| KR | 10-2008-0004212 A | 1/2008 |
| KR | 1020150121678 A | 10/2015 |

(Continued)

*Primary Examiner* — Amanda C. Walke

(74) *Attorney, Agent, or Firm* — Muir Patent Law, PLLC

(57) ABSTRACT

A method of manufacturing a semiconductor device, the method including forming a lower film on a substrate; forming a metal-containing photoresist material film on the lower film; patterning the metal-containing photoresist material film to form a photoresist pattern including openings therein such that a scum remains on the lower film; performing a descum operation to remove the scum from the lower film; and etching the lower film using the photoresist pattern, wherein performing the descum operation includes providing the substrate to a processing chamber; generating oxygen plasma; and reacting the scum with the oxygen plasma.

20 Claims, 19 Drawing Sheets

(56)  References Cited

U.S. PATENT DOCUMENTS

| | | | |
|---|---|---|---|
| 2013/0330928 A1* | 12/2013 | Ishikawa | H01L 21/67225 |
| | | | 118/728 |
| 2015/0056542 A1* | 2/2015 | Meyers | G03F 7/30 |
| | | | 430/296 |
| 2020/0133133 A1 | 4/2020 | Park et al. | |
| 2020/0135487 A1* | 4/2020 | Lee | H01L 21/0337 |
| 2020/0144061 A1* | 5/2020 | Mignot | G03F 7/40 |
| 2020/0371439 A1* | 11/2020 | Meyers | G03F 7/0043 |
| 2021/0041784 A1 | 2/2021 | Chen et al. | |
| 2022/0020584 A1* | 1/2022 | Volosskiy | H01L 21/308 |
| 2022/0216050 A1* | 7/2022 | Yu | H01L 21/31138 |
| 2022/0293587 A1* | 9/2022 | Liao | G03F 7/0043 |
| 2023/0408916 A1* | 12/2023 | de Schepper | G03F 7/36 |
| 2023/0416606 A1* | 12/2023 | Dictus | G03F 7/0042 |
| 2024/0231224 A9* | 7/2024 | Weidman | G03F 7/0043 |
| 2025/0060674 A1* | 2/2025 | Li | G03F 7/40 |

FOREIGN PATENT DOCUMENTS

| | | | | |
|---|---|---|---|---|
| KR | 1020210095218 A | 7/2021 | | |
| WO | WO-2020223011 A1 * | 11/2020 | | H01L 21/0228 |
| WO | WO-2024196643 A1 * | 9/2024 | | H01L 21/31144 |

* cited by examiner

METHOD OF MANUFACTURING SEMICONDUCTOR DEVICE

CROSS-REFERENCE TO RELATED APPLICATION

This application is based on and claims priority under 35 U.S.C. § 119 to Korean Patent Application No. 10-2021-0118548, filed on Sep. 6, 2021 in the Korean Intellectual Property Office, the disclosure of which is incorporated by reference herein in its entirety.

BACKGROUND

1. Field

Embodiments relate to a method of manufacturing a semiconductor device.

2. Description of the Related Art

In accordance with the rapid development of the electronics industry and consumer demands, small-sized, high-performance, and low-power semiconductors have been considered. Accordingly, pattern sizes of semiconductor devices are also reducing.

SUMMARY

The embodiments may be realized by providing a method of manufacturing a semiconductor device, the method including forming a lower film on a substrate; forming a metal-containing photoresist material film on the lower film; patterning the metal-containing photoresist material film to form a photoresist pattern including openings therein such that a scum remains on the lower film; performing a descum operation to remove the scum from the lower film; and etching the lower film using the photoresist pattern, wherein performing the descum operation includes providing the substrate to a processing chamber; generating oxygen plasma; and reacting the scum with the oxygen plasma.

The embodiments may be realized by providing a method of manufacturing a semiconductor device, the method including forming a lower film on a substrate; forming a metal-containing photoresist material film on the lower film; patterning the metal-containing photoresist material film on the lower film to form a photoresist pattern including openings therein such that a scum remains on the lower film; performing a first descum operation of removing at least some of the scum from the lower film; performing a second descum operation of removing any residual scum from the lower film; and etching the lower film using the photoresist pattern, wherein performing the first descum operation includes providing the substrate to a processing chamber; generating oxygen plasma; and reacting the scum with the oxygen plasma.

The embodiments may be realized by providing a method of manufacturing a semiconductor device, the method including forming a lower film on a substrate; forming a metal-containing photoresist material film on the lower film; patterning the metal-containing photoresist material film on the lower film to form a metal-containing photoresist pattern including openings therein such that a scum remains on the lower film; performing a descum operation of removing the scum from the lower film; and plating a metal on the lower film using the metal-containing photoresist pattern, wherein the lower film includes a metal seed layer, and performing the descum operation includes providing the substrate to a processing chamber, generating oxygen plasma, and reacting the scum with the oxygen plasma.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
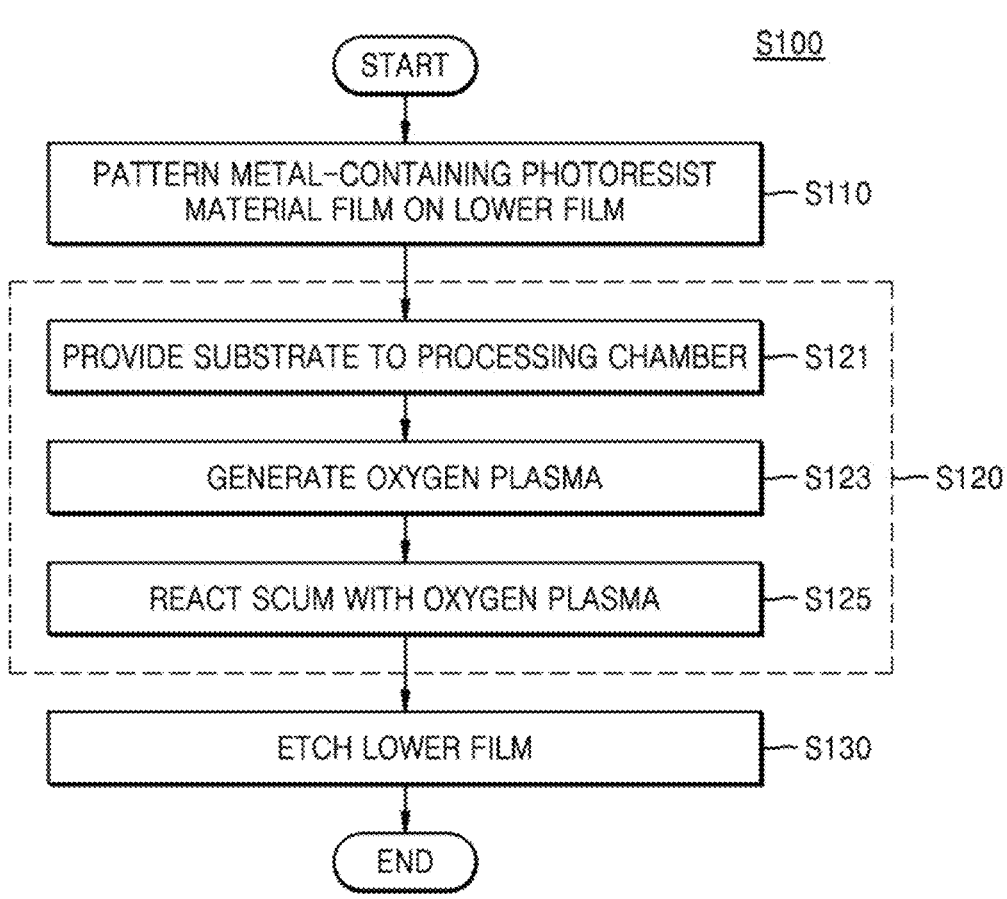
FIG. 1 is a flowchart of a method of manufacturing a semiconductor device, according to an example embodiment.

FIG. 1 is a flowchart of a method S100 of manufacturing a semiconductor device, according to example embodiments. FIGS. 2A to 2G are conceptual diagrams of stages in a method of manufacturing a semiconductor device, according to an example embodiment.

Referring to FIGS. 1 and 2A to 2C, operation S110 of patterning a metal-containing photoresist material film 15 may include applying a metal-containing photoresist material film 15, exposing the metal-containing photoresist material film 15, and developing the metal-containing photoresist material film 15.

In operations of a method of manufacturing a semiconductor device, according to an example embodiment, a semiconductor device 10 may include a substrate 11, a lower film 13, and the metal-containing photoresist material film 15. Through a subsequent operation, the metal-containing photoresist material film 15 may be removed, and at least a partial area of the lower film 13 may be removed.

The substrate 11 may include, e.g., a group IV semiconductor such as silicon (Si) or germanium (Ge), a group IV-IV compound semiconductor such as silicon germanium (SiGe) or silicon carbide (SiC), or a group III-V compound semiconductor such as gallium arsenide (GaAs), indium arsenide (InAs), or indium phosphorus (InP). The substrate 11 may include a conductive area, e.g., a well doped with an impurity or a structure doped with an impurity. As used herein, the term "or" is not an exclusive term, e.g., "A or B" would include A, B, or A and B.

The lower film 13 may be on the substrate 11. In an implementation, the lower film 13 may include a metal layer including, e.g., titanium (Ti), copper (Cu), aluminum (Al), tungsten (W), tin (Sn), nickel (Ni), or an alloy thereof. In an implementation, the lower film 13 may include an insulating layer, e.g., silicon oxide (SiO$_2$), silicon nitride (SiN) or silicon oxynitride (SiON). In an implementation, the lower film 13 may include a carbon material, e.g., a carbon compound or a polymer material such as a spin-on hardmask (SOH) or an amorphous carbon layer (ACL). In an implementation, lower film 13 may include, e.g., a bottom anti-reflective coating (BARC) layer. In an implementation, when the lower film 13 includes an insulating layer, the BARC layer may be on the insulating layer. In an implementation, as illustrated in FIGS. 2A to 2C, 2F and 2G, the lower film 13 may include a single layer, or the lower film 13 may include a plurality of layers. When the lower film 13 includes a plurality of layers, each of the plurality of layers may include a different material. In an implementation, when the lower film 13 includes two layers, a first layer on the substrate 11 may be a metal seed layer, and a second layer on the first layer may be an insulating layer. The lower film 13 may be formed by a deposition operation, e.g., chemical vapor deposition (CVD) or physical vapor deposition (PVD), or a coating operation, e.g., spin coating. When the lower film 13 includes a plurality of layers, each of the plurality of layers may be formed by repeating a deposition or coating operation.

The metal-containing photoresist material film 15 may be on the lower film 13. In an implementation, the metal-containing photoresist material film 15 may include, e.g., a metal structure including an organometallic compound, an organometallic nanoparticle, or an organometallic cluster.

In an implementation, the metal structure may include a metal core including one or more metal atoms, and at least one organic ligand surrounding the metal core. In the metal structure, an ionic bond, a covalent bond, a metal bond, or a van der Waals bond may be between the metal core and the at least one organic ligand. The metal atom may include at least one metal element. The at least one metal element may include a metal atom, a metallic ion, a metal compound, a metal alloy, or a combination thereof. The metal compound may include, e.g., a metal oxide, a metal nitride, a metal oxynitride, a metal silicide, a metal carbide, or a combination thereof.

In an implementation, the metal core may include, e.g., tin (Sn), hafnium (Hf), zirconium (Zr), titanium (Ti), zinc (Zn), cobalt (Co), nickel (Ni), copper (Cu), aluminum (Al), silver (Ag), or iron (Fe).

In an implementation, the at least one organic ligand may include, e.g., a C1 to C30 straight chain alkyl group, a C3 to C30 branched alkyl group, a C3 to C30 cycloalkyl group, a C2 to C30 alkenyl group, a C2 to C30 alkynyl group, a C6 to C30 aryl group, a C3 to C30 allyl group, a C1 to C30 alkoxy group, a C6 to C30 aryloxy group, or a combination thereof. In an implementation, the organic ligand may include a methyl group, an ethyl group, a propyl group, a butyl group, an isopropyl group, a tert-butyl group, a tert-amyl group, a sec-butyl group, a cyclopropyl group, a cyclobutyl group, a cyclopentyl group, or a cyclohexyl group. The organic ligand may include an aromatic ring, a heteroaromatic ring, or a combination thereof. The metal structure may include a plurality of organic ligands, and two of the plurality of organic ligands may form one cyclic alkyl moiety.

The metal-containing photoresist material film 15 may include, e.g., either a positive metal-containing photoresist or a negative metal-containing photoresist.

The metal-containing photoresist material film 15 may have high absorbance to extreme-ultraviolet (EUV) light and high etch resistance. Accordingly, a patterning performance of a fine pattern may be improved by using the metal-containing photoresist material film 15.

Figure 2A:
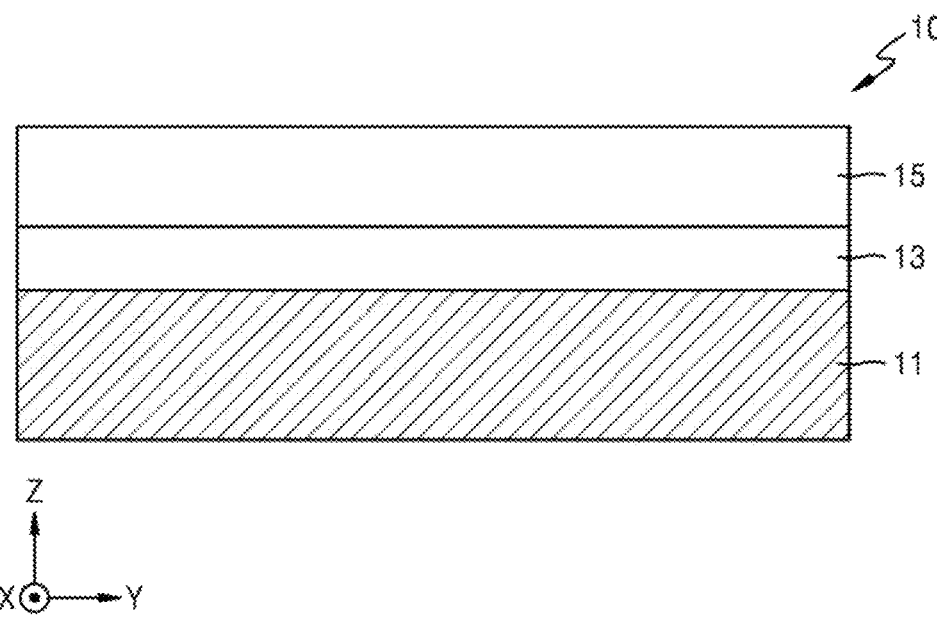
FIGS. 2A to 2G are conceptual diagrams of stages in a method of manufacturing a semiconductor device, according to an example embodiment.

Referring to FIGS. 1 and 2A, the metal-containing photoresist material film 15 may be coated on the lower film 13. The metal-containing photoresist material film 15 may be coated, e.g., by a spin-coating method. In an implementation, the metal-containing photoresist material film 15 may have a thickness of, e.g., about 200 nm to about 600 nm. The metal-containing photoresist material film 15 may be a photoresist material film sensitive to deep-ultraviolet (DUV) light, mid-ultraviolet (MUV) light, or EUV light. In an implementation, the metal-containing photoresist material film 15 may be sensitive to EUV light. In an implementation, an operation of baking the metal-containing photoresist material film 15 coated on the lower film 13 may be further included in operation S110 of patterning the metal-containing photoresist material film 15. In an implementation, the operation of baking the metal-containing photoresist material film 15 may be performed at, e.g., about 110° C. for about 1 minute. A solvent for spin-coating on the lower film 13 may be removed by baking the metal-containing photoresist material film 15. Through this operation, the metal-containing photoresist material film 15 may bond better with the lower film 13.

Figure 2B:
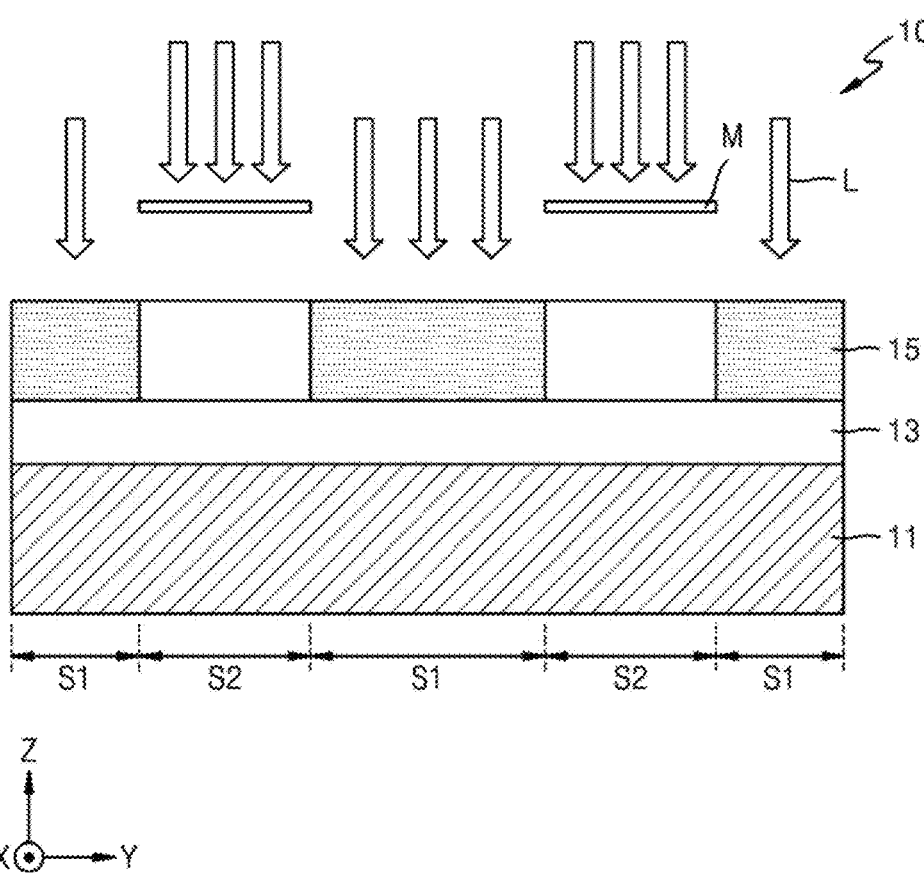

Referring to FIGS. 1 and 2B, the metal-containing photoresist material film 15 may be exposed to light L. Before the light L is irradiated onto the metal-containing photoresist material film 15, a photomask M may be arranged on at least a partial area of the metal-containing photoresist material film 15. In an implementation, the photomask M may block light in (e.g., may prevent light from being irradiated on) a second area S2 of the metal-containing photoresist material film 15 and may transmit light in or onto a first area 51 of the metal-containing photoresist material film 15. As a result, the light L may be selectively irradiated onto the first area 51 of the metal-containing photoresist material film 15 on which the photomask M is not arranged. In an implementation, the photomask M may be a EUV photomask. Light irradiated to the metal-containing photoresist material film 15 may be EUV light. The EUV light may have a wavelength of, e.g., about 4 nm to about 124 nm. In an implementation, the EUV light may have a wavelength of about 4 nm to about 20 nm. In an implementation, the EUV light may have a wavelength of about 13.5 nm. The EUV light may be generated by, e.g., a laser produced plasma (LPP) method of irradiating a laser beam to a metal droplet including, e.g., Sn. As the metal-containing photoresist material film 15 is irradiated with light, the at least one organic ligand of the metal structure may be separated, and the metal cores may be coupled to each other.

In an implementation, operation S110 of patterning the metal-containing photoresist material film 15 may further include a post exposure bake (PEB) operation of baking the metal-containing photoresist material film 15, which is exposed. In an implementation, the PEB operation may be performed, e.g., at about 130° C. for about 3 minutes to about 5 minutes. Through the PEB operation, physical stress of the metal-containing photoresist material film 15, which is exposed, may be reduced, and a standing wave effect generated during exposure may be reduced.

Figure 2C:
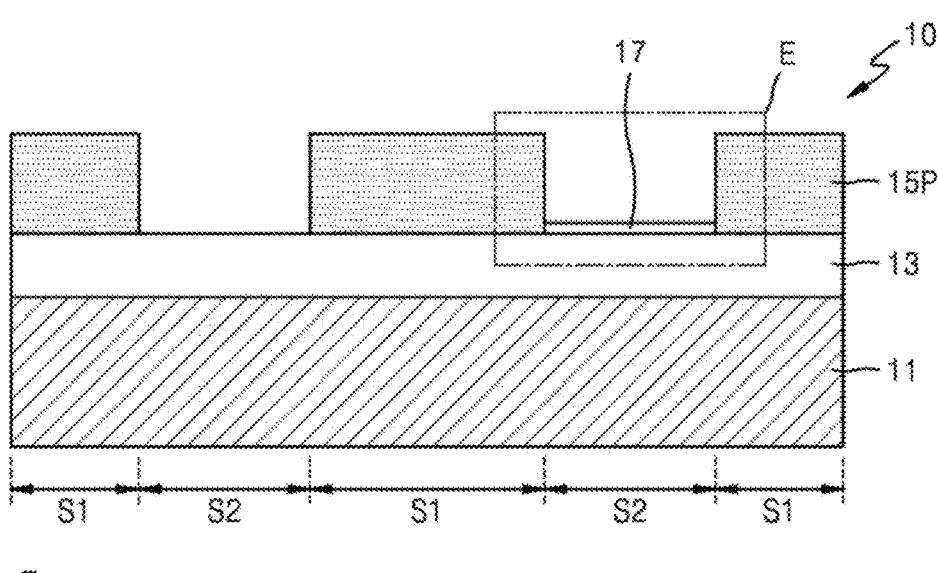
Figure 2C:
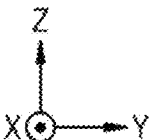
Figure 2D:
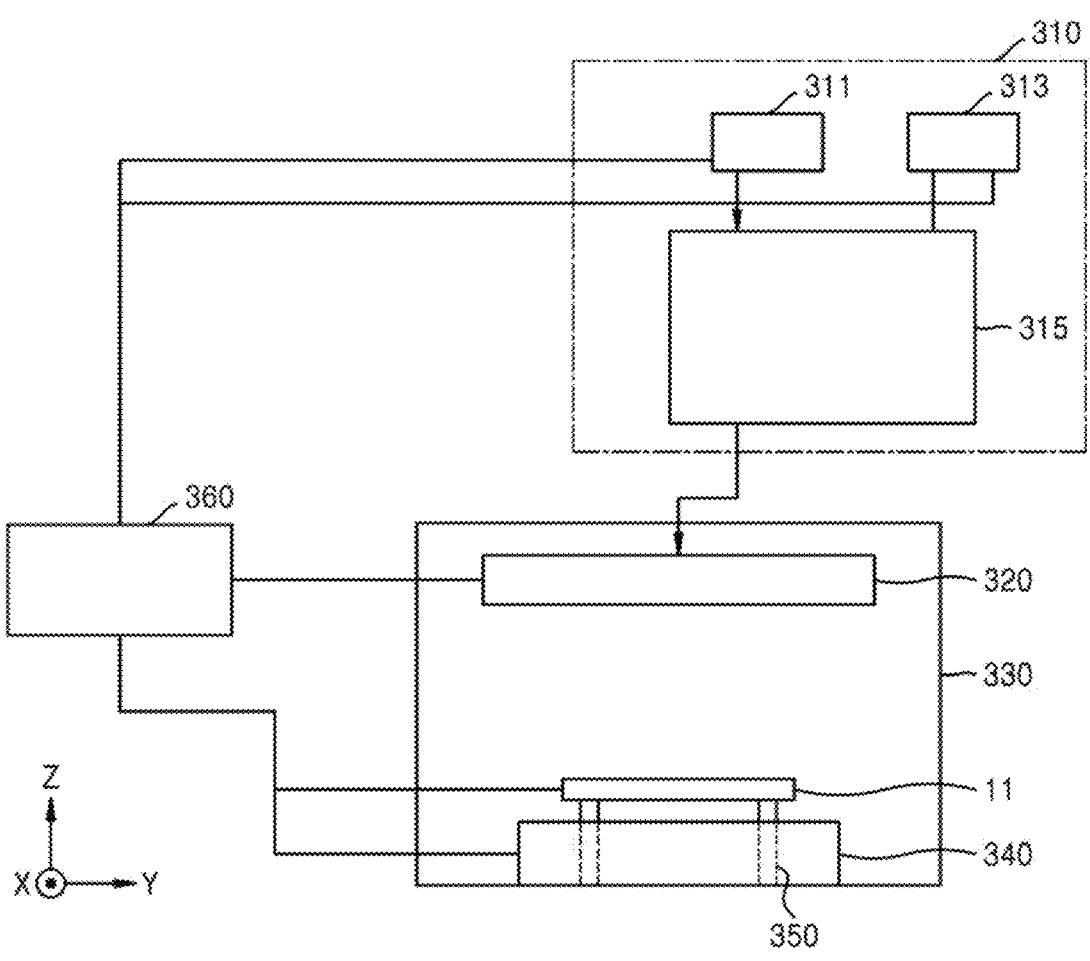
Figure 2E:
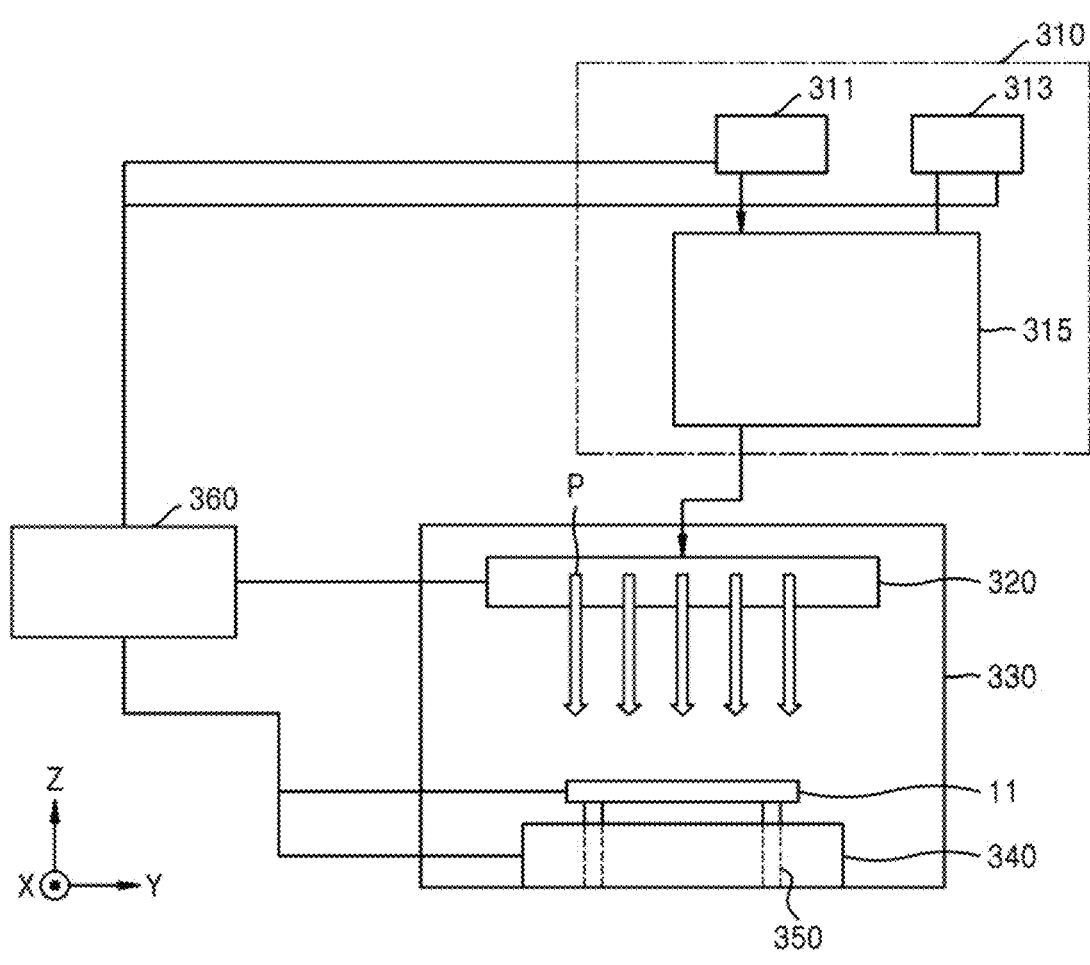
Figure 2F:
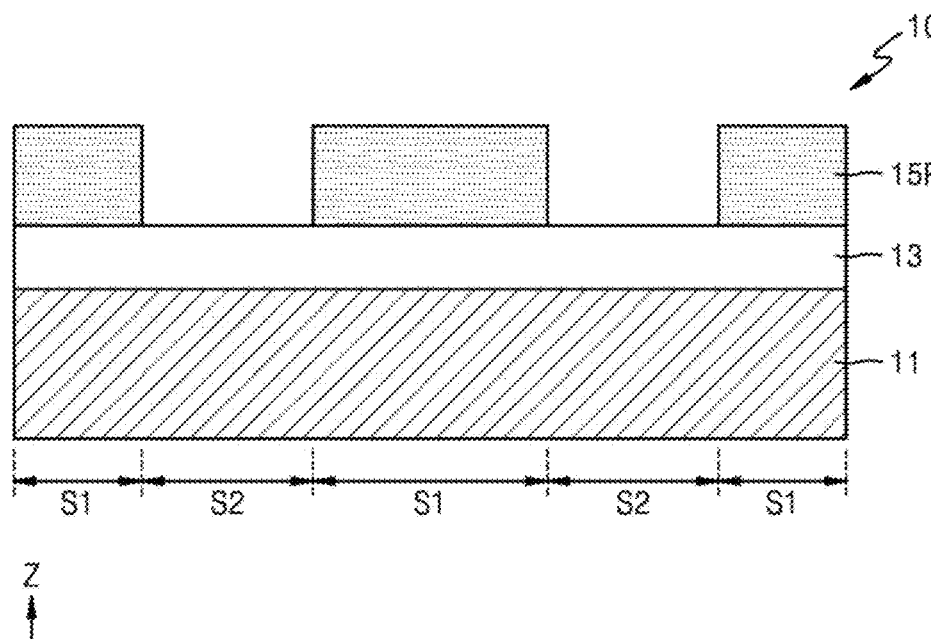

Referring to FIGS. 1 and 2C, the metal-containing photoresist material film 15 may be developed by a developing solution. When the metal-containing photoresist material film 15 is a negative photoresist, the developing solution may include a propylene glycol monomethyl ether acetate (PGMEA) developing solution. In this case, the second area S2 of the metal-containing photoresist material film 15, which is not irradiated with the light L, may be removed, and only the first area 51 of the metal-containing photoresist material film 15 may remain and form a photoresist pattern. In an implementation, when the metal-containing photoresist material film 15 is a positive photoresist, the developing solution may be a water-soluble developing solution, e.g., tetramethylammonium hydroxide (TMAH). In this case, the first area 51 of the metal-containing photoresist material film 15, which is irradiated with the light L, may be removed, and only the second area S2 of the metal-containing photoresist material film 15 may remain and form a photoresist pattern 15P.

The metal cores of the metal-containing photoresist material film 15 in the second area S2 (which is not exposed in the exposure operation of the metal-containing photoresist material film 15) may be bonded together due to a stochastic effect or diffusion of radicals, or when remaining organic ligand materials remain in the second area S2 of the lower film 13 even after the development of the metal-containing photoresist material film 15, the metal cores bonded to each other or the remaining organic ligand materials may form scum 17. In an implementation, the scum 17 may include, e.g., a footing or a stringer.

In an implementation, a ratio of a surface area to a volume of the footing or a ratio of a surface area to a volume of the stringer may be greater than a ratio of a surface area to a volume of the photoresist pattern 15P.

If the scum 17 were not removed, a pattern defect of the semiconductor device could occur in a subsequent operation using the photoresist pattern 15P.

Referring to FIGS. 1 and 2D to 2F, an oxygen plasma P treatment may be performed to remove the scum 17 in a partial area of the second area S2. The oxygen plasma P treatment may be performed using a plasma processing device 300.

The plasma processing device 300 may include a plasma generating device or plasma generator 310, a showerhead 320, a processing chamber 330, a substrate support 340, a substrate mover 350, and a controller 360.

The plasma generator 310 may include a gas supply 311, a power supply 313, and a plasma generating chamber 315. The gas supply 311 may supply a plasma generating gas to the plasma generating chamber 315. In an implementation, the plasma generating gas may include, e.g., about 5 volume percent to about 100 volume percent of oxygen. In an implementation, the plasma generating gas may include, e.g., about 20 volume percent to about 80 volume percent, about 30 volume percent to about 70 volume percent, or about 40 volume percent to about 60 volume percent of oxygen. In an implementation, the plasma generating gas may further include an additional gas, e.g., an inert gas. In an example embodiment, the additional gas may include, e.g., argon (Ar), helium (He), or nitrogen ($N_2$).

The gas supply 311 may be configured to transmit and receive an electrical signal to and from the controller 360. An operation of the gas supply 311 may be controlled by the controller 360. In an implementation, the operation of the gas supply 311 may be controlled by the controller 360, so that a flow rate of the plasma generating gas may be adjusted. In an implementation, the flow rate of the plasma generating gas may be, e.g., about 10 standard cubic centimeters per minute (sccm) to about 500 sccm. In an implementation, the flow rate of the plasma generating gas may be, e.g., about 50 sccm to about 400 sccm, or about 100 sccm to about 300 sccm.

The power supply 313 may supply power to the plasma generating chamber 315. The power supply 313 may be configured to control high frequency and low frequency of radio frequency (RF) power sources independently of each other. In an implementation, the low frequency of RF may include, e.g., a frequency between about 0 kHz to about 500 kHz. In an implementation, the high frequency of RF may include, e.g., a frequency of about 1.8 MHz to about 2.45 GHz, about 13.56 MHz or more, 27 MHz or more, 40 MHz or more, or 60 MHz or more. The power supply 313 may supply RF power suited for a suitable frequency. In an implementation, the power supply 313 may supply RF power suited for a frequency of 13.56 MHz suited for high-frequency inductively coupled plasma (ICP). The RF power supplied by the power supply 313 may be, e.g., about 300 W Station to about 2,000 W Station, about 1,200 W Station to about 1,800 W Station, or about 1,400 W Station to about 1,600 W Station. The power supply 313 may be configured to transmit and receive an electrical signal to and from the controller 360. An operation of the power supply 313 may be controlled by the controller 360. In an implementation, the operation of the power supply 313 may be controlled by the controller 360, so that the RF power may be adjusted.

In the plasma generating chamber 315, oxygen plasma P may be generated. The plasma generating gas may be supplied from the gas supply 311 to the plasma generating chamber 315, and the oxygen plasma P may be generated by the RF power supplied by the power supply 313. The generated oxygen plasma P may be high-density plasma.

The showerhead 320 may be in the processing chamber 330. The oxygen plasma P may be directed to the substrate 11 through the showerhead 320 in the plasma generator 310. The showerhead 320 may include a mechanism for controlling a temperature thereof. In an implementation, the showerhead 320 may control a temperature thereof by using a heat exchanger system such as a fluid heater/cooler. The showerhead 320 may help prevent excessive heat from being generated in an operation of removing the scum 17 on the substrate 11 through cooling. The showerhead 320 may include a plurality of holes. According to a thickness of the showerhead 320, an amount of the oxygen plasma P passing through the showerhead 320 may vary. The showerhead 320 may have a suitable shape for directing the oxygen plasma P toward the substrate 11, e.g., a disk shape. A Y-axis length of the showerhead 320 may be greater than a Y-axis length of the substrate 11 or may be about equal to the Y-axis length of the substrate 11. The showerhead 320 may be configured to transmit and receive an electrical signal to and from the controller 360. An operation of the showerhead 320 may be controlled by the controller 360. In an implementation, the operation of the showerhead 320 may be controlled by the controller 360, so that the temperature of the showerhead 320 or the amount of the oxygen plasma P may be adjusted.

The processing chamber 330 may be below the plasma generator 310. The scum 17 on the substrate 11 may be removed by reacting with the oxygen plasma P in the processing chamber 330. In an implementation, a pressure in the processing chamber 330 may be, e.g., about 4 mtorr to about 100 mtorr. In an implementation, the pressure in the processing chamber 330 may be, e.g., about 10 mtorr to about 90 mtorr, about 30 mtorr to about 70 mtorr, or about 40 mtorr to about 60 mtorr. In an implementation, a temperature of the processing chamber 330 may be, e.g., about 20° C. to about 80° C. In an implementation, the temperature of the processing chamber 330 may be, e.g., about 30° C. to about 70° C., or about 40° C. to about 60° C.

The substrate support 340 may be in the processing chamber 330. The substrate support 340 may support the substrate 11 in the processing chamber 330. The substrate support 340 may be extended or moved vertically to adjust a distance between the substrate 11 and the showerhead 320. The substrate support 340 may further include a mechanism for adjusting a temperature thereof. In an implementation, the substrate support 340 may include one or more fluid channels. The one or more fluid channels may circulate a heat transfer fluid to actively cool or heat the substrate support 340. The temperature of the substrate support 340 may be controlled through the circulation of the heat transfer fluid, and thus, the temperature of the substrate 11 may be controlled. The temperature of the substrate 11 may be maintained at, e.g., about 20° C. to about 80° C., about 30° C. to about 70° C., or about 40° C. to about 60° C. The substrate support 340 may include, e.g., a pedestal or the like. The substrate support 340 may be configured to transmit and receive an electrical signal to and from the controller 360. An operation of the substrate support 340 may be controlled by the controller 360. In an implementation, the operation of the substrate support 340 may be controlled by the controller 360, so that the temperature of the substrate support 340 may be adjusted.

The substrate mover 350 may be inside the processing chamber 330. The substrate mover 350 may vertically move the substrate 11, thereby adjusting a distance between the substrate 11 and the substrate support 340. The substrate mover 350 may include at least two lift pins. The substrate mover 350 may be in contact with a bottom surface of the substrate 11. The substrate mover 350 may be configured to transmit and receive an electrical signal to and from the controller 360. An operation of the substrate mover 350 may be controlled by the controller 360. In an implementation, the operation of the substrate mover 350 may be controlled by the controller 360, so that the distance between the substrate 11 and the substrate support 340 may be adjusted.

The controller 360 may be configured to control the operations of the gas supply 311, the power supply 313, the showerhead 320, the substrate support 340, and the substrate mover 350. In an implementation, the controller 360 may be configured to transmit and receive an electrical signal to and from the gas supply 311, the power supply 313, the showerhead 320, the substrate support 340, and the substrate mover 350, and accordingly, may be configured to control the operations of the gas supply 311, the power supply 313, the showerhead 320, the substrate support 340, and the substrate mover 350.

The controller 360 may be implemented in hardware, firmware, software, or any combination thereof. In an implementation, the controller 360 may be a computing device such as a workstation computer, a desktop computer, a laptop computer, a tablet computer, or the like. In an implementation, the controller 360 may include a memory device, such as read only memory (ROM), random access memory (RAM), or the like, and a processor configured to perform certain operations and algorithms, e.g., a microprocessor, a central processing unit (CPU), a graphics processing unit (GPU), or the like. In an implementation, the controller 360 may include a receiver and a transmitter for receiving and transmitting electrical signals.

Hereinafter, operation S120 of performing a descum operation of removing the scum 17 is described. Operation S120 of performing a descum operation may include operation S121 of providing the substrate 11 to the processing chamber 330, operation S123 of generating the oxygen plasma P, and operation S125 of reacting the scum 17 on the substrate 11 with the oxygen plasma P.

In operation S121 of providing the substrate 11 to the processing chamber 330, the substrate 11 may be provided on the substrate support 340 in the processing chamber 330. The substrate 11 may be arranged parallel to the showerhead 320, and spaced apart in a Z-axis direction, and may be arranged to overlap an inner area of the showerhead 320 in the Z-axis direction, so that the scum 17 on the substrate 11 may react with the oxygen plasma P.

After the substrate 11 is provided to the processing chamber 330, in operation S123, the oxygen plasma P may be generated by the plasma generator 310. The gas supply 311 may supply a plasma generating gas to the plasma generating chamber 315, and RF power may be supplied by the power supply 313 to generate the oxygen plasma P.

In operation S125, the oxygen plasma P may be directed to the processing chamber 330 through the showerhead 320, and accordingly, the scum 17 on the substrate 11 may react with the oxygen plasma P. A carbon material on the scum 17 (e.g., generated due to bonding between metal cores or the presence of residual organic ligands in some of non-exposed areas on the substrate 11) may be exposed to the oxygen plasma P and reacted with the oxygen of the oxygen plasma P. Through this reaction, carbon on the scum 17 may be removed in the form of, e.g., carbon dioxide ($CO_2$).

Figure 2G:
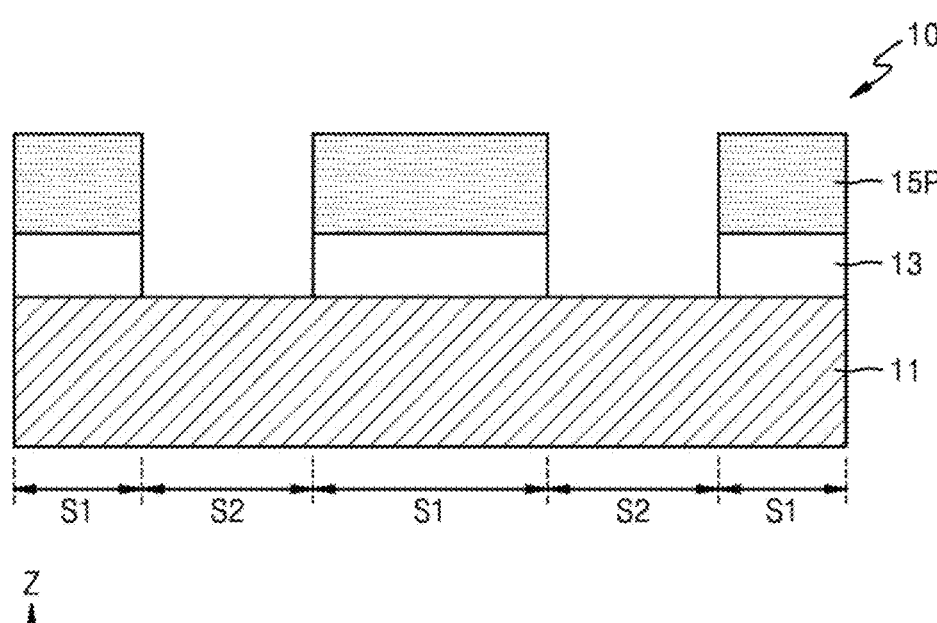
Figure 2G:
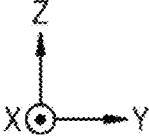

Referring to FIGS. 1 and 2G, in operation S130, the lower film 13 may be etched through the photoresist pattern 15P on the substrate 11. The etching operation may include, e.g., plasma etching using plasma. In an implementation, as illustrated in the drawings, the lower film 13 may include a single layer, or may include a plurality of layers. In an implementation, the lower film 13 may include two layers. The lower film 13 may include, e.g., an amorphous carbon layer (ACL) or SiON. In an implementation, when the lower film 13 includes a plurality of layers, the plurality of layers may include different materials from each other. The lower film 13 may be a hard mask. In a semiconductor microprocessing operation, as an aspect ratio of a photoresist increases, a photoresist pattern could collapse. The lower film 13 may be used as a hard mask to help prevent such a collapse.

Figure 3A:
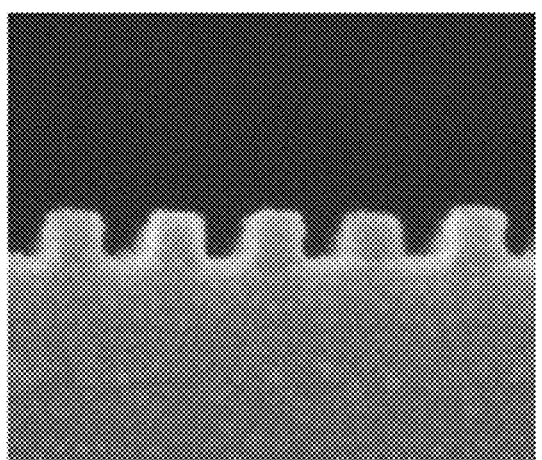
FIGS. 3A and 3B are images showing before and after stages of a metal-containing photoresist pattern according to an example embodiment.
Figure 3B:
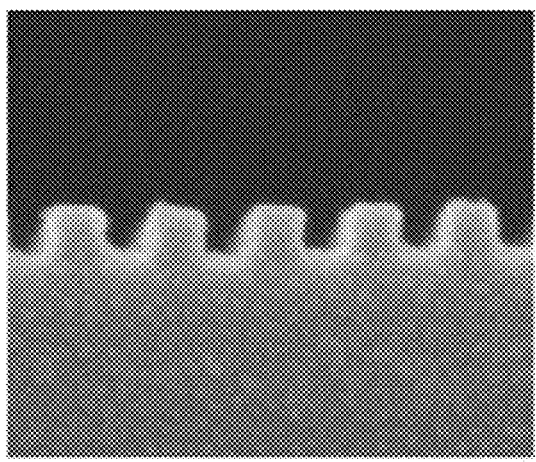

FIG. 3A is an image of the photoresist pattern 15P before an oxygen plasma treatment. FIG. 3B is an image of the photoresist pattern 15P after an oxygen plasma treatment.

In other methods, scum may be removed through overetching a photoresist, and a photoresist loss could be large. However, a removal method of the scum 17 of example embodiments includes a reaction between the scum 17 and oxygen plasma, rather than an increase in an etch amount, a large photoresist loss may be prevented.

Figure 4:
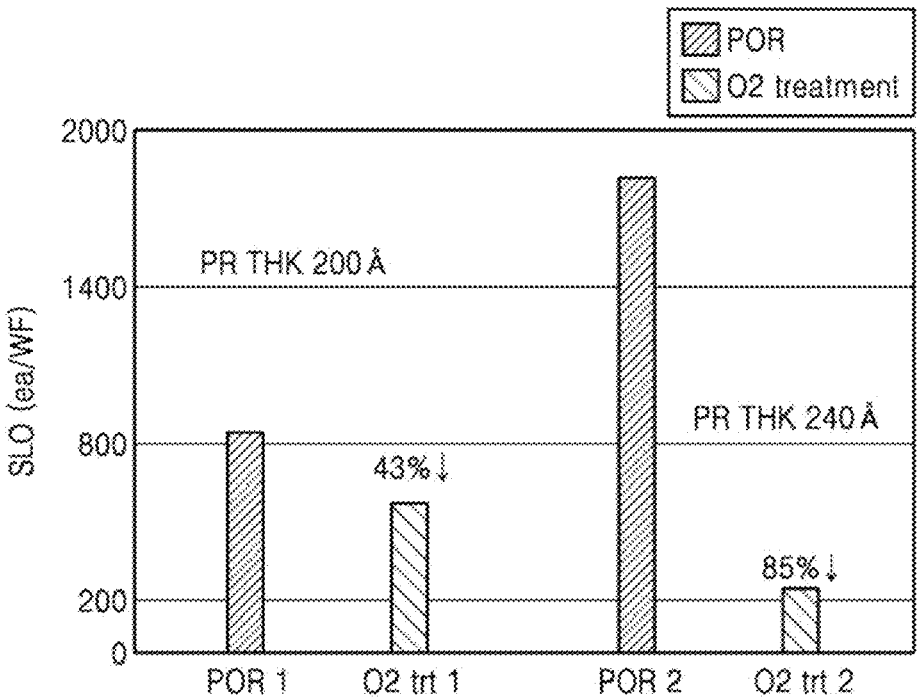
FIG. 4 is a graph showing a bridge defect of a pattern according to an oxygen plasma treatment.

FIG. 4 is a graph showing a bridge defect of a pattern according to an oxygen plasma treatment. POR on the horizontal axis on a graph of FIG. 4 indicates a case in which a descum operation is not performed, and O2 trt indicates a case in which a descum operation is performed. The vertical axis on the graph of FIG. 4 indicates the number of pattern bridge defects in each case indicated on the horizontal axis.

Referring to FIG. 4, when a thickness of the metal-containing photoresist material film 15 is about 200 angstroms, it may be seen that the number of pattern bridge defects may be reduced by about 43% through an oxygen plasma treatment. In addition, when the thickness of the metal-containing photoresist material film 15 is about 240 angstroms, it may be seen that the number of pattern bridge defects may be reduced by about 85% through an oxygen plasma treatment. As described above, through example embodiments, photoresist pattern defects may be improved (e.g., prevented), and finally, a yield of semiconductor devices may be increased.

Figure 5:
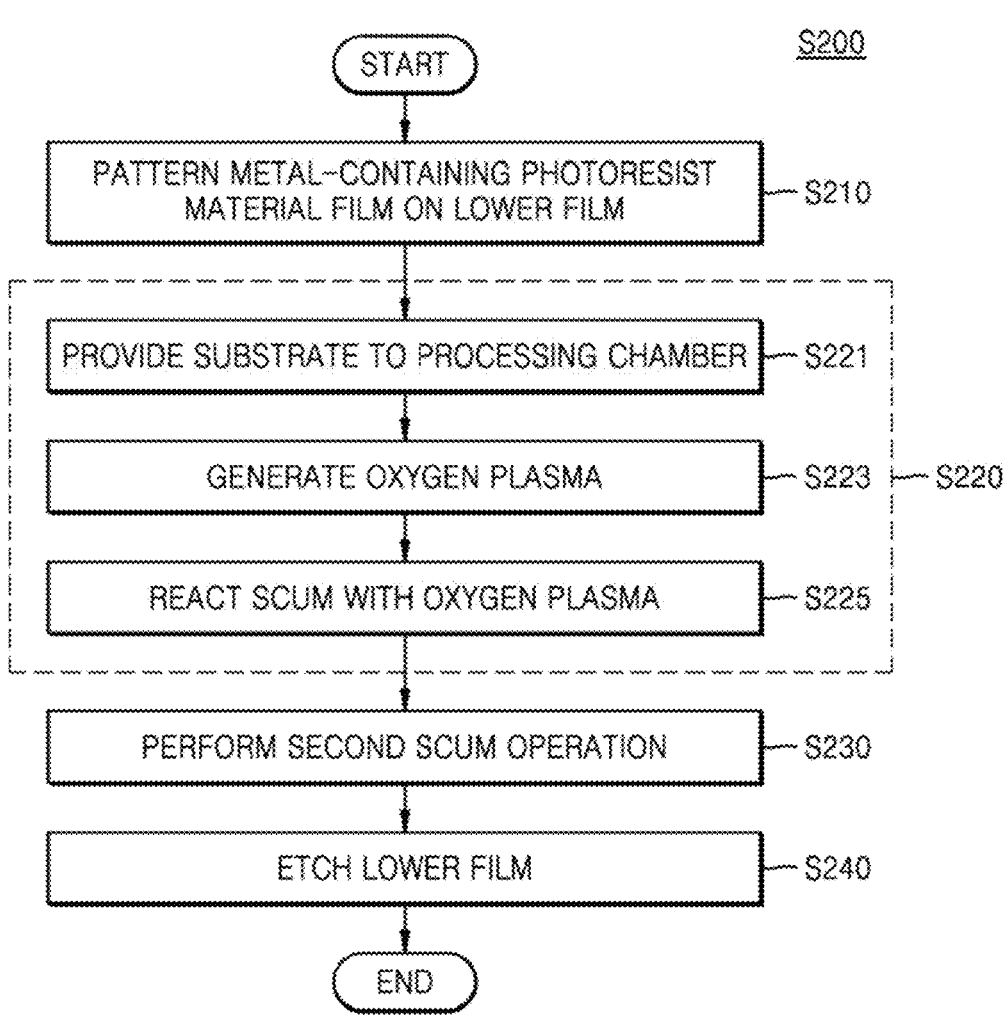
FIG. 5 is a flowchart of a method of manufacturing a semiconductor device, according to an embodiment.

FIG. 5 is a flowchart of a method S200 of manufacturing a semiconductor device, according to an embodiment.

Referring to FIG. 5, the method S200 of manufacturing a semiconductor device may include operation S210 of patterning the metal-containing photoresist material film 15, operation S220 of performing a first descum operation, operation S230 of performing a second descum operation, and operation S240 of etching a lower film. Operation S210 of patterning the metal-containing photoresist material film 15, operation S220 of performing a first descum operation, and operation S240 of etching a lower film are the same as above descriptions already given with reference to FIGS. 1 and 2A to 2G, and thus, operation S230 of performing a second descum operation is mainly described hereinafter.

FIGS. 6A to 6E are enlarged views of a portion corresponding to an area E of FIG. 2C.

Referring to FIGS. 5 and FIGS. 6A to 6D, in an example embodiment, the method S200 of manufacturing a semiconductor device may include operation S220 of performing a first descum operation and operation S230 of performing a second descum operation.

Figure 6A:
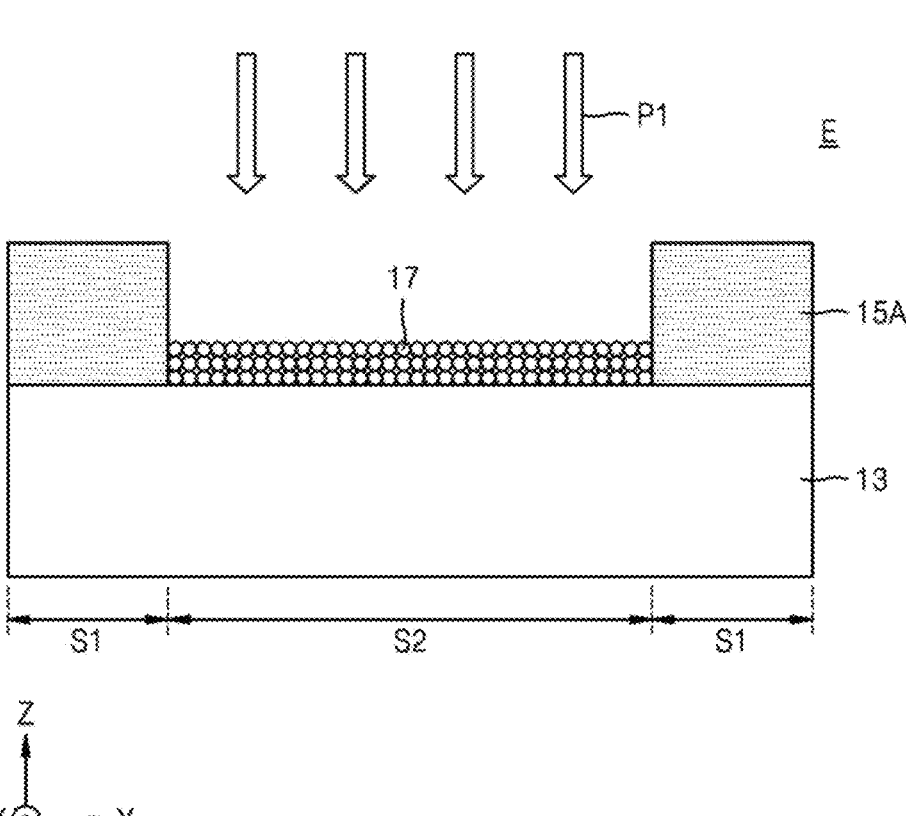
FIGS. 6A to 6D are conceptual diagrams of a first descum operation and a second descum operation of a method of manufacturing a semiconductor device, according to an embodiment.
Figure 6B:
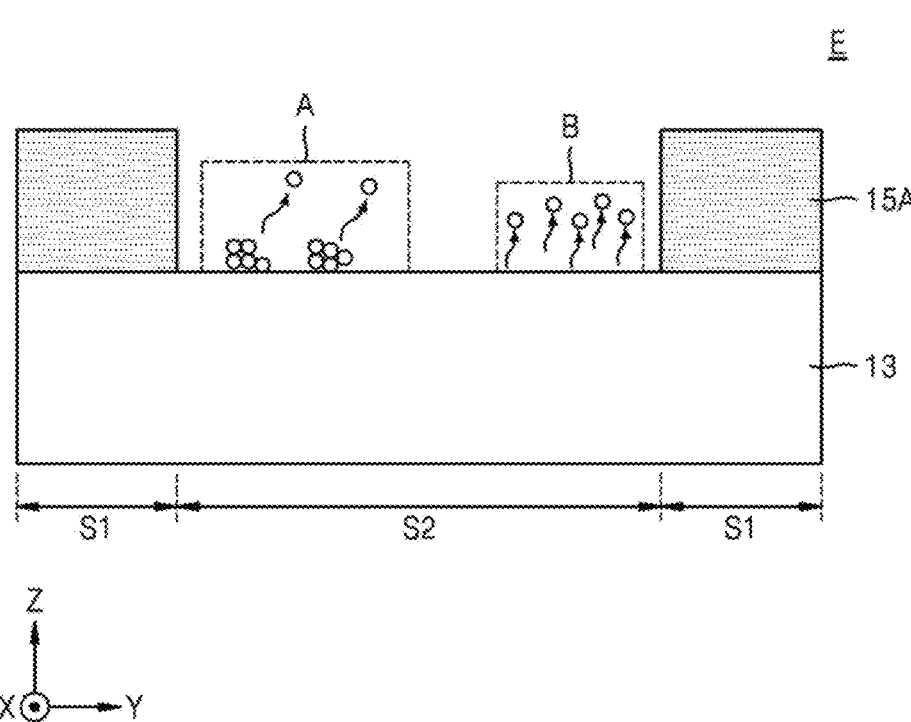

Referring to FIGS. 6A and 6B, in operation S220 of performing a first descum operation, residual organic ligands and a carbon material in a metal cluster may be removed by reacting with oxygen plasma P1. At this time, the scum 17 generated by the residual organic ligands may be removed by reacting with the oxygen plasma P1 as shown in an area B in FIG. 6B. However, in a case in which the scum 17 is formed by bonding metal clusters to each other, only a portion thereof may be removed by reacting with the oxygen plasma P1, and a portion thereof may remain as shown in an area A in FIG. 6B.

Figure 6C:
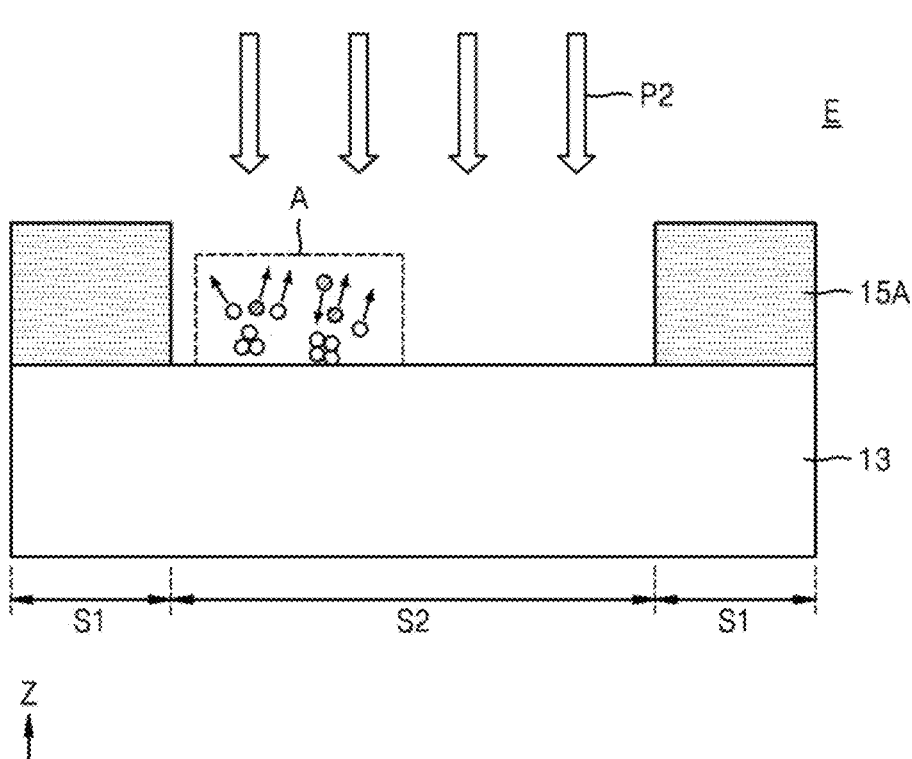
Figure 6D:
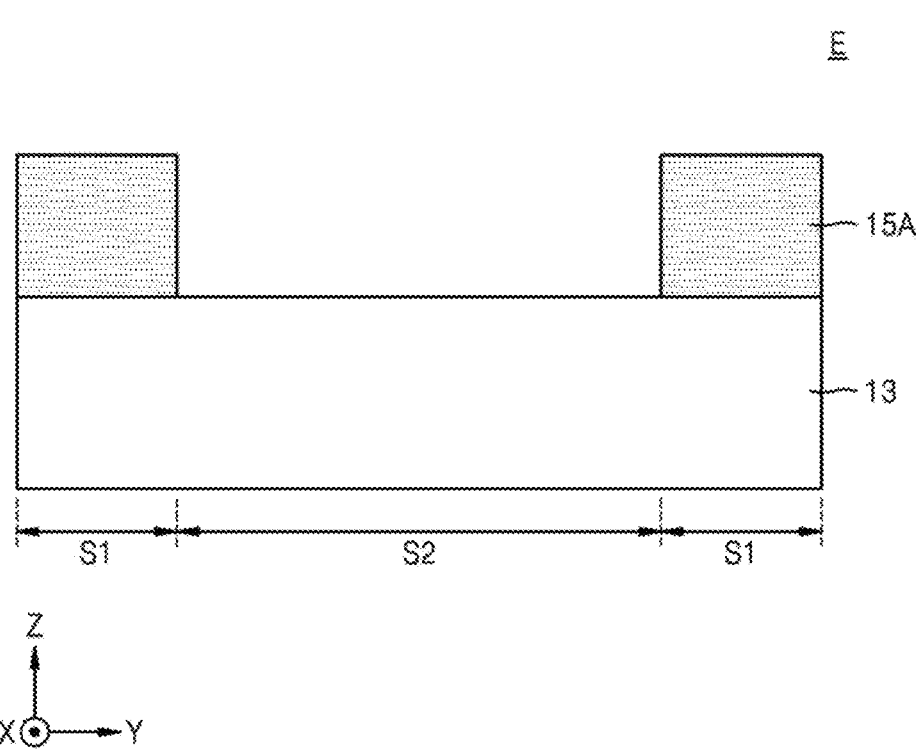

Referring to FIGS. 6C and 6D, the scum 17 that remained and was not removed after operation S220 of performing a first descum operation may be removed by operation S230 of performing a second descum operation. In an implementation, operation S230 of performing a second descum operation may include sputtering using plasma P2.

In an implementation, when the lower film 13 is a carbon-containing lower film, the plasma P2 used in operation S230 of performing a second descum operation may be plasma including oxygen. In an implementation, the plasma including oxygen may further include a halogen element. In an implementation, the plasma including oxygen may further include an inert gas, e.g., helium (He), argon (Ar), or the like.

In an implementation, when the lower film 13 is a lower film including $SiO_2$ or SiON, the plasma P2 used in operation S230 of performing a second descum operation may be, e.g., plasma including a halogen element such as fluorine (F). In this case, the plasma may further include an inert gas, e.g., He, Ar, or the like.

A bonding force between the scum 17 remaining in the area A after operation S220 of performing a first descum operation and the lower film 13 may be weakened by operation S220 of performing a first descum operation. Accordingly, the scum 17 remaining in the area A may be easily removed through operation S230 of performing a second descum operation. Pattern defects of a semiconductor device may be further improved or prevented by additionally performing operation S230 of performing a second descum operation.

Figure 7:
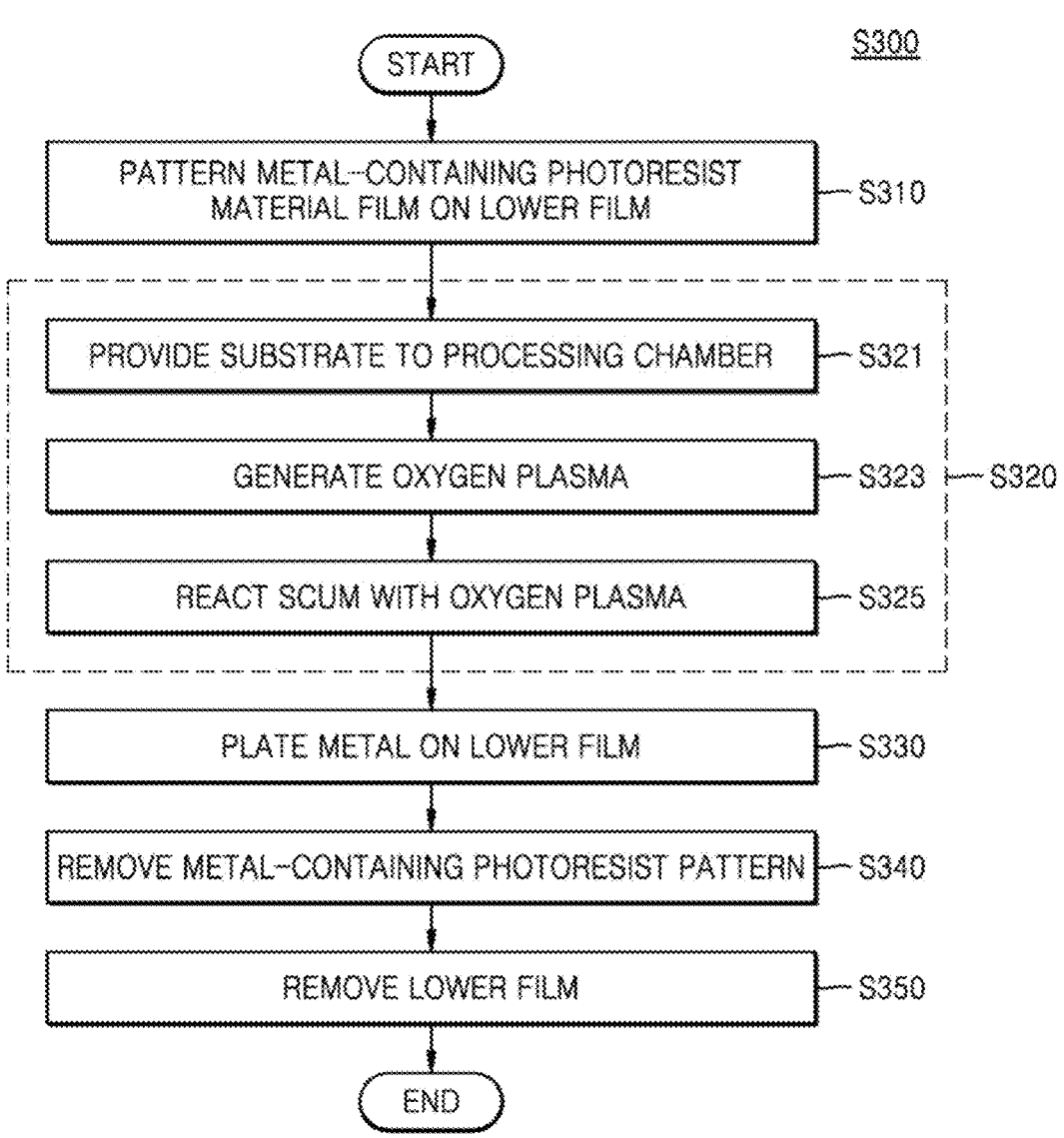
FIG. 7 is a flowchart of a method of manufacturing a semiconductor device, according to an embodiment.

FIG. 7 is a flowchart of a method S300 of manufacturing a semiconductor device, according to an embodiment. FIGS.

8A to 8C are conceptual diagrams of stages in a method of manufacturing a semiconductor device, according to an embodiment.

Referring to FIG. 7, the method S300 of manufacturing a semiconductor, device, according to an embodiment, may include operation S310 of patterning the metal-containing photoresist material film 15, operation S320 of performing a descum operation, operation S330 of plating a metal on a lower film 13b, operation S340 of removing the photoresist pattern 15P, and operation S350 of removing the lower film 13b. Operation S310 of patterning the metal-containing photoresist material film 15 and operation S320 of performing a descum operation are the same as above descriptions already given with reference to FIGS. 1 and 2A to 2G, and thus, operation S340 of removing the photoresist pattern 15P and operation S350 of removing the lower film 13b are mainly described hereinafter.

In the method S300 of manufacturing a semiconductor device, according to an embodiment, a semiconductor device 10b may include the substrate 11, the lower film 13b, and a plating layer 19.

Figure 8A:
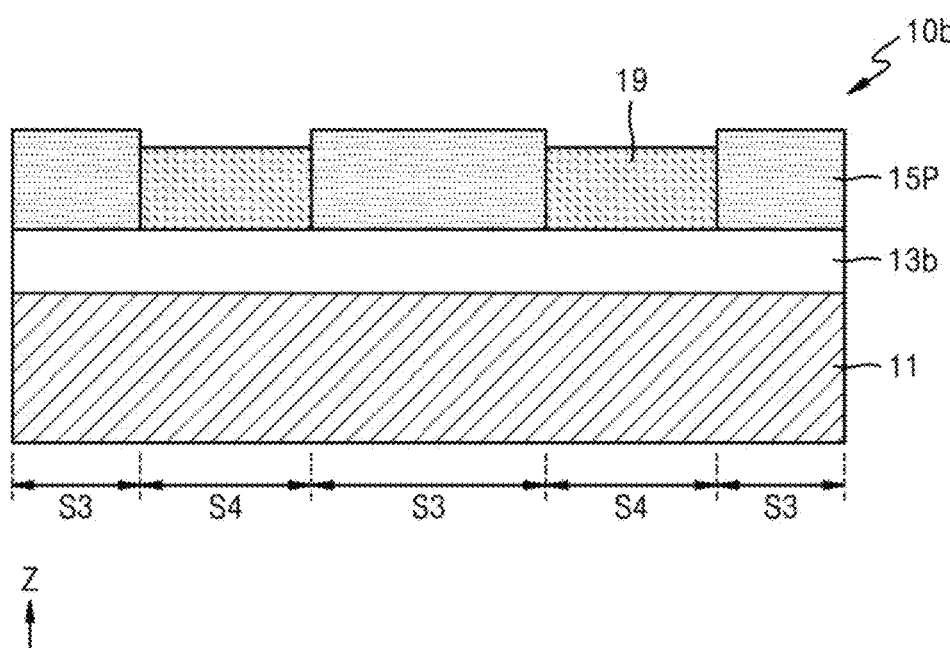
FIGS. 8A to 8C are conceptual diagrams of stages in a method of manufacturing a semiconductor device, according to an embodiment.

Referring to FIGS. 7 and 8A, in operation S330, plating may be performed on a fourth area S4 of the lower film 13b. Operation S330 of performing plating may include electroplating or electroless plating.

In a case of an electroplating operation, pre-wetting the substrate 11, immersing the substrate 11 in an electrolyte, electroplating a material, removing the substrate 11 from a plating solution, and drying the substrate 11 may be performed.

The pre-wetting of the substrate 11 may be performed by a pre-wetting solution. Pre-wetting may be performed by, e.g., spraying a pre-wetting solution onto the substrate 11 through a nozzle or the like. The pre-wetting solution may include, e.g., demineralized water or a plating solution. By performing the pre-wetting, air bubbles may occur less when the substrate 11 is immersed in an electrolyte.

After the pre-wetting, the substrate 11 may be obliquely immersed in an electrolyte. When the substrate 11 is immersed in an electrolyte, the substrate 11 may be generally rotated.

After the substrate 11 is immersed in the electrolyte, electroplating may be performed on the fourth area S4 of the lower film 13b by using the photoresist pattern 15P. The plating layer 19 may be formed in the fourth area S4 through electroplating. The plating layer 19 may include, e.g., Cu, Ni, Al, Sn, or an alloy thereof.

After electroplating, the substrate 11 may be removed from a plating solution and dried by a spin-rinse-dry method.

In an implementation, as illustrated in the drawings, the plating layer 19 may be a single layer in FIG. 8A. In an implementation, the plating layer 19 may include three layers. In an implementation, materials of a plurality of layers of the plating layer 19 may be different from each other.

Figure 8B:
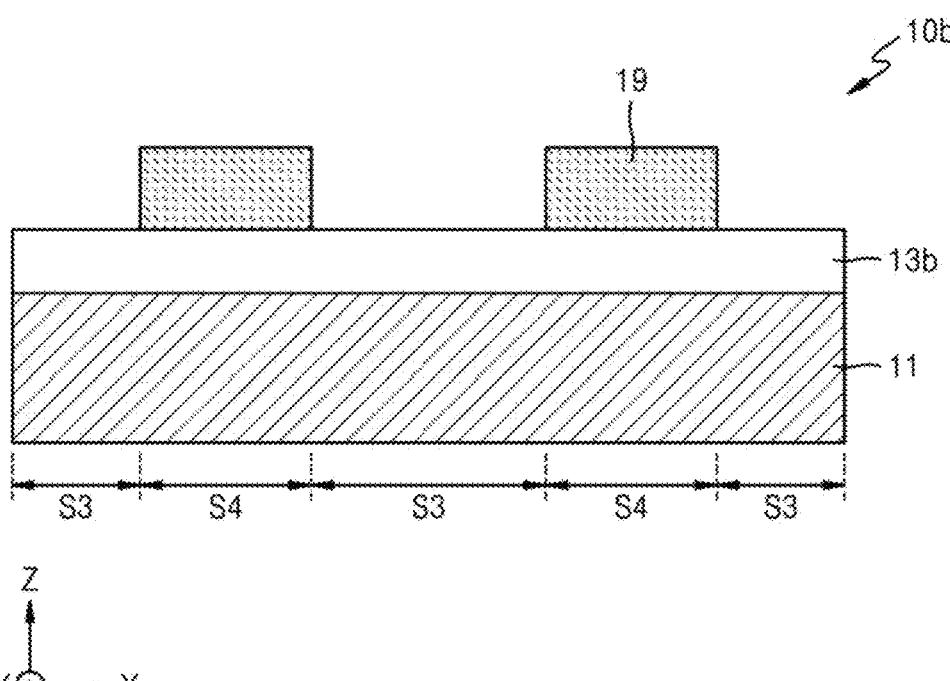

Referring to FIGS. 7 and 8B, in operation S340, the photoresist pattern 15P may be removed. The photoresist pattern 15P may be removed through, e.g., an etching operation using hydrogen plasma or plasma including a halogen gas such as bromine (Br).

Figure 8C:
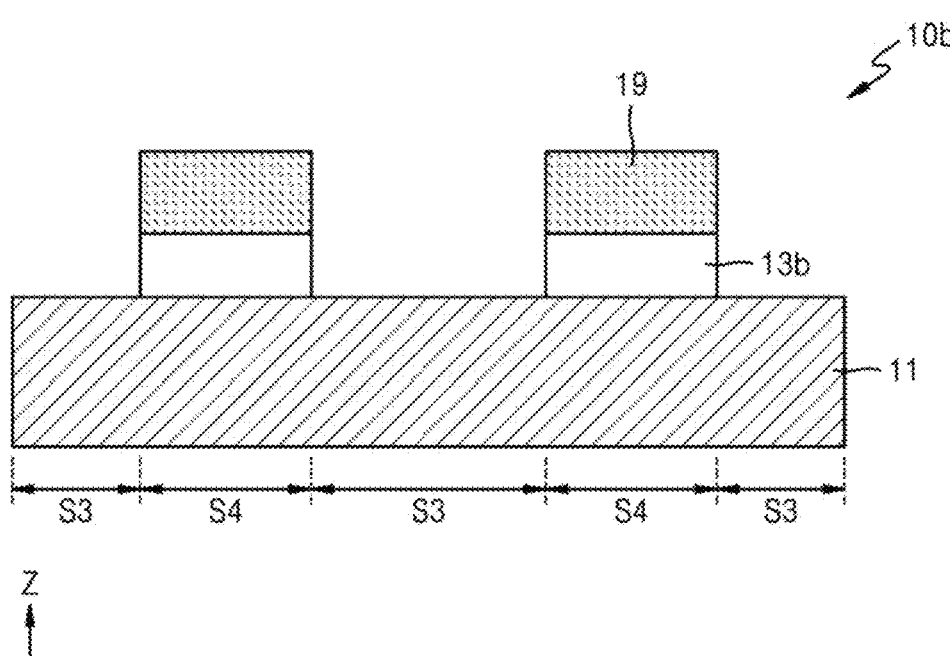

Referring to FIGS. 7 and 8C, in operation S350, the lower film 13b in a third area S3 may be removed. The lower film 13b may be a metal seed layer to electrically connect the substrate 11 to an external device. The lower film 13b may include, e.g., Cu. The lower film 13b may be removed by, e.g., wet chemical etching. When the lower film 13b includes a plurality of layers, a first layer, which is exposed, may be removed first, and then a second layer below the first layer may be sequentially removed. In an implementation, an etching solution for removing each of the plurality of layers may be different.

After removing the lower film 13*b*, when an external connection terminal is not plated in a plating operation, an operation of adding an external connection terminal may be performed. The external connection terminal may be arranged on the plating layer 19 to contact an upper surface of the plating layer 19. The external connection terminal may be, e.g., a solder ball or a bump. A material forming the external connection terminal may include, e.g., Cu, Ni, Al, Co, Zn, or Sn.

After the external connection terminal is formed, a reflow operation may be performed. Through the reflow operation, the external connection terminal may form a conductive interface on the plating layer 19.

By way of summation and review, pattern defects, such as pattern bridges, could occur due to technical difficulties according to pattern miniaturization. Accordingly, a method of manufacturing a semiconductor device in which pattern defects are reduced or prevented, has been considered.

One or more embodiments may provide a method of manufacturing a semiconductor device, the method being capable of increasing a yield of the semiconductor device by reducing or preventing pattern defects of the semiconductor device.

One or more embodiments may provide a method of manufacturing a semiconductor device, the method reducing or preventing pattern defects.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
forming a lower film on a substrate;
forming a metal-containing photoresist material film on the lower film;
patterning the metal-containing photoresist material film to form a photoresist pattern including openings therein such that a scum remains on the lower film, wherein the patterning includes developing the metal-containing photoresist material film using a developing solution;
performing a descum operation to remove the scum from the lower film; and
etching the lower film using the photoresist pattern,
wherein performing the descum operation includes:
providing the substrate to a processing chamber;
generating oxygen plasma; and
reacting the scum with the oxygen plasma.

2. The method as claimed in claim 1, wherein:
generating the oxygen plasma includes using a plasma generating gas, and the plasma generating gas includes 5 volume percent to 100 volume percent of oxygen, based on a total volume of the plasma generating gas.

3. The method as claimed in claim 1, wherein:
generating the oxygen plasma includes using a plasma generating gas, and
a flow rate of the plasma generating gas during the descum operation is 10 standard cubic centimeters per minute (sccm) to 500 sccm.

4. The method as claimed in claim 1, wherein a pressure in the processing chamber during the descum operation is a pressure of 4 mtorr or greater and 100 mtorr or less.

5. The method as claimed in claim 1, wherein a temperature of the processing chamber during the descum operation is a temperature of 20° C. or greater and 80° C. or less.

6. The method as claimed in claim 1, wherein:
reacting the scum with the oxygen plasma includes exposing the scum to the oxygen plasma, and
an exposure time of the scum to the oxygen plasma during the descum operation is 5 seconds to 30 seconds.

7. The method as claimed in claim 1, wherein:
generating the oxygen plasma includes applying radio frequency (RF) power to a plasma generating gas, and
the RF power is 300 W to 2,000 W.

8. The method as claimed in claim 1, wherein:
the metal-containing photoresist material film includes a metal structure including an organometallic compound, an organometallic nanoparticle, or an organometallic cluster, and
the metal structure includes:
a metal core including one or more metal atoms, and
at least one organic ligand surrounding the metal core.

9. The method as claimed in claim 8, wherein the one or more metal atoms include at least one metal atom selected from the group consisting of tin (Sn), hafnium (Hf), zirconium (Zr), titanium (Ti), and zinc (Zn).

10. The method as claimed in claim 1, wherein:
generating the oxygen plasma includes using a plasma generating gas, and
the plasma generating gas used during the descum operation further includes an inert gas.

11. The method as claimed in claim 10, wherein the inert gas includes argon (Ar), helium (He), or nitrogen ($N_2$).

12. The method as claimed in claim 1, wherein the scum includes a footing or a stringer.

13. The method as claimed in claim 12, wherein:
a ratio of a surface area to a volume of the footing is greater than a ratio of a surface area to a volume of the photoresist pattern, or
a ratio of a surface area to a volume of the stringer is greater than a ratio of a surface area to a volume of the photoresist pattern.

14. A method of manufacturing a semiconductor device, the method comprising:
forming a lower film on a substrate;
forming a metal-containing photoresist material film on the lower film;
patterning the metal-containing photoresist material film on the lower film to form a photoresist pattern including openings therein such that a scum remains on the lower film, wherein the patterning includes developing the metal-containing photoresist material film using a developing solution;
performing a first descum operation of removing at least some of the scum from the lower film;
performing a second descum operation of removing any residual scum from the lower film; and etching the lower film using the photoresist pattern, wherein performing the first descum operation includes:

providing the substrate to a processing chamber;

generating oxygen plasma; and reacting the scum with the oxygen plasma.

15. The method as claimed in claim 14, wherein performing the second descum operation includes performing a sputtering operation using plasma.

16. The method as claimed in claim 15, wherein the plasma includes oxygen.

17. The method as claimed in claim 15, wherein the plasma includes a halogen element.

18. The method as claimed in claim 16, wherein the plasma further includes a halogen element.

19. The method as claimed in claim 16, wherein the plasma further includes an inert gas.

20. A method of manufacturing a semiconductor device, the method comprising:

forming a lower film on a substrate;

forming a metal-containing photoresist material film on the lower film;

patterning the metal-containing photoresist material film on the lower film to form a metal-containing photoresist pattern including openings therein such that a scum remains on the lower film, wherein the patterning includes developing the metal-containing photoresist material film using a developing solution;

performing a descum operation of removing the scum from the lower film; and plating a metal on the lower film using the metal-containing photoresist pattern, wherein:

the lower film includes a metal seed layer, and performing the descum operation includes:

providing the substrate to a processing chamber, generating oxygen plasma, and reacting the scum with the oxygen plasma.

\* \* \* \* \*